(12) United States Patent
Cohen

(10) Patent No.: US 7,242,623 B2
(45) Date of Patent: Jul. 10, 2007

(54) NON-VOLATILE MEMORY CELL DEVICE, PROGRAMMING ELEMENT AND METHOD FOR PROGRAMMING DATA INTO A PLURALITY OF NON-VOLATILE MEMORY CELLS

(75) Inventor: Zeev Cohen, Zichron-Yaakov (IL)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 122 days.

(21) Appl. No.: 11/179,345

(22) Filed: Jul. 12, 2005

(65) Prior Publication Data
US 2007/0016720 A1    Jan. 18, 2007

(51) Int. Cl.
G11C 7/06 (2006.01)
(52) U.S. Cl. .......................... 365/189.07; 365/185.33; 365/185.09
(58) Field of Classification Search ........... 365/189.07, 365/185.33, 185.09, 185.22, 189.08, 201
See application file for complete search history.

(56) References Cited

U.S. PATENT DOCUMENTS

| | | | |
|---|---|---|---|
| 5,430,674 A | 7/1995 | Javanifard | |
| 5,557,668 A | 9/1996 | Brady | |
| 5,872,794 A | 2/1999 | Cook et al. | |
| 5,970,005 A * | 10/1999 | Yin et al. | 365/201 |
| 6,418,506 B1 | 7/2002 | Pashley et al. | |
| 6,826,663 B2 * | 11/2004 | Perego et al. | 711/156 |
| 2004/0090825 A1 | 6/2004 | Nam et al. | |
| 2004/0193774 A1 | 9/2004 | Nyata et al. | |

* cited by examiner

*Primary Examiner*—Richard T. Elms
*Assistant Examiner*—Dang Nguyen
(74) *Attorney, Agent, or Firm*—Slater & Matsil, L.L.P.

(57) ABSTRACT

A programming element for programming data into a plurality of non-volatile memory cells of a non-volatile memory cell array, the data being transferred to the non-volatile memory cell array in a data word comprising a plurality of data items. The programming element comprises a detection element for detecting at least a first data word and a second data word which are to be transferred to the non-volatile memory cell array, a determination element for determining the number of data items in the first data word and the second data word that need a change of the state of a respective non-volatile memory cell, a comparator element for comparing the determined number of data items with a maximum number of programmable data items using one programming pulse, a data word merge control element for merging the first data word with the second data word into a merged data word to be programmed into the non-volatile memory cell array if the determined number is less or equal to the maximum number, wherein the merged data word is to be programmed into the non-volatile memory cells together using the same at least one programming pulse.

20 Claims, 4 Drawing Sheets

NON-VOLATILE MEMORY CELL DEVICE, PROGRAMMING ELEMENT AND METHOD FOR PROGRAMMING DATA INTO A PLURALITY OF NON-VOLATILE MEMORY CELLS

TECHNICAL FIELD

The present invention relates to non-volatile memory cell devices, programming elements and methods for programming data into a plurality of non-volatile memory cells.

BACKGROUND

FIG. 5 shows a block diagram of a conventional flash memory card 500 and an information processing appliance 501 (which is referred to as a host hereinafter). The flash memory card 500 is connected with the host 501 through, for example, five different times of clients or busses, a data line or a data bus 502, a clock line 503, a power line 504, which provides the power supply voltage $V_{DD}$, a ground line 505 providing a second reference potential, usually the ground potential $V_{SS}$, and a command line 506, which is used to transfer commands from the host 501 to the flash memory card 500.

A host interface 507 of the flash memory card 500 receives commands from the host 501 through the command line 506 and decodes the received commands. When the command is a write command, for example, the host interface 507 decodes the command into a logical address 508 provided by the host 501 as the writing destination of data and sends the logical address 508 to a flash memory controller 509 of the flash memory card 500. Furthermore, the host interface 507 receives data objects 510 to be written from the data line 502 and stores the data objects 510 in a data buffer 511.

In the flash memory controller 509, an address conversion section (not shown) is fed from the host interface 501 with the logical address 508 showing the writing destination of the data object 510. The address conversion section brings the physical addresses of generally more than one area into correspondence with one logical address. Here, one area is equivalent to, for example, two pages inside a non-volatile memory cell array 512 comprising a multiplicity of non-volatile memory cells of the flash memory 513. In particular, the pages belonging to the same area each belong to separate physical blocks. The non-volatile flash memory cell array 512 is generally divided into more than one page each having a fixed number of memory cells, and further divided into more than one physical block each having a fixed number of pages. Each of the memory cells can take two states, "1" and "0". Thereby, one of the memory cells can store 1-bit data therein, in the following also referred to as data item.

The address conversion section, when fed with the logical address 508, showing the writing destination of the data object 510, selects a free blank area in the memory cell array 512 and assigns the write target area of the data object 510 to the respective free area. The address conversion section further brings the physical address 514 of this area in correspondence with the above-mentioned logical address 508.

A write section (not shown) sends the physical address 514 of the write target area to an address decoder 515 of the flash memory 513. In conjunction with that, the write section sends the data object 510 to be written from the data buffer 511 to a page buffer 516 of the flash memory 513.

The flash memory 513 comprises, for example, two page buffers 516. Each of the page buffers 516 can store one-page data. In other words, the two page buffers 516 can store one-area data in total. Accordingly, the data objects 510 to be written, in the following also denoted as data words, which are sent out from the data buffer 511, are stored in the page buffers 516 on an area-by-area basis. The one-area data items, i.e., the data words, stored in the two page buffers 516 are written in parallel onto the two pages designated by the address decoder 515. Thus, the conventional flash memory card 500 performs the data writing into the flash memory 513 in the two physical blocks in parallel, thereby shortening the writing duration, wherein data words of a predefined fixed length are used, usually using a data word of 128 bits length.

The flash memory card 500 brings the physical address of the area in which the new data is to be written, into correspondence with the logical address showing the writing destination. In addition, in the flash memory, data items are erased only collectively in each of the physical blocks mentioned above.

In some common flash memory cells, only a predetermined maximum number of flash memory cells can be programmed with using one programming pulse due to the current needed for changing the state of a flash memory cell, which is usually implemented by means of a floating gate transistor or a charge trapping layer transistor.

In a common flash memory card 500, no overwriting of an already programmed flash memory cell is possible. Usually, before writing new data in a physical block, which has already been programmed, the physical block is firstly erased and then, after the erased process has been finished, the new data is programmed into this physical block.

The erase process is performed by means of an erasing circuit 517, which is coupled to the read section and is provided with the physical address and with the non-volatile memory cell array 512 and the address decoder 515.

Since usually, a flash memory card 500 is used in a portable information processing appliance, such as a notebook computer, a personal digital assistant (PDA), or/and a digital camera, and records large quantities of digital data such as image data in the internal recording media, there is need to improve the memory device architecture and corresponding method for programming a non-volatile memory cell array in order to save the required energy for programming. Furthermore, the programming speed is also needed to be increased in order to improve the usability of the device.

SUMMARY OF THE INVENTION

The present invention provides an improved programming element and an improved method for programming as well as an improved non-volatile memory cell device, whereby the performance enhancement is achieved in respect to the time required for programming the memory device and the current needed for the programming.

The invention optimizes the memory device and memory array architecture in terms of power and performance by merging data words to be written into a non-volatile memory cell array whenever possible with respect to the available programming voltage pulse.

In other words, as many data words as possible are merged together and are programmed into the non-volatile memory cell array with one and the same programming pulse. In an exemplary embodiment of the invention, a programming element for programming data into a plurality of non-volatile memory cells of a non-volatile memory cell array, the data being transferred to the non-volatile memory cell array in a data word comprising a plurality of data items, comprises a detection element for detecting at least a first data word and a second data word which are to be transferred to the non-volatile memory cell array. Furthermore, a determination element is provided for determining the number of data items in the first data word and the second data word that need a change of the state of a respective non-volatile memory cell. A comparator element compares the determined number of data items with a, for example predetermined, maximum number of programmable data items using one programming pulse. A data word merge controller merges the first data word with the second data word into merged data word to be programmed into the non-volatile memory cell array if the determined number is less or equal to the maximum number, wherein the merged data word is to be programmed into the non-volatile memory cells together using the same programming pulse.

These and other features of the invention will be better understood when taken in view of the following drawings and detailed description.

BRIEF DESCRIPTION OF THE DRAWINGS

For a more complete understanding of the present invention, and the advantages thereof, reference is now made to the following descriptions taken in conjunction with the accompanying drawing, in which.

Figure 1:
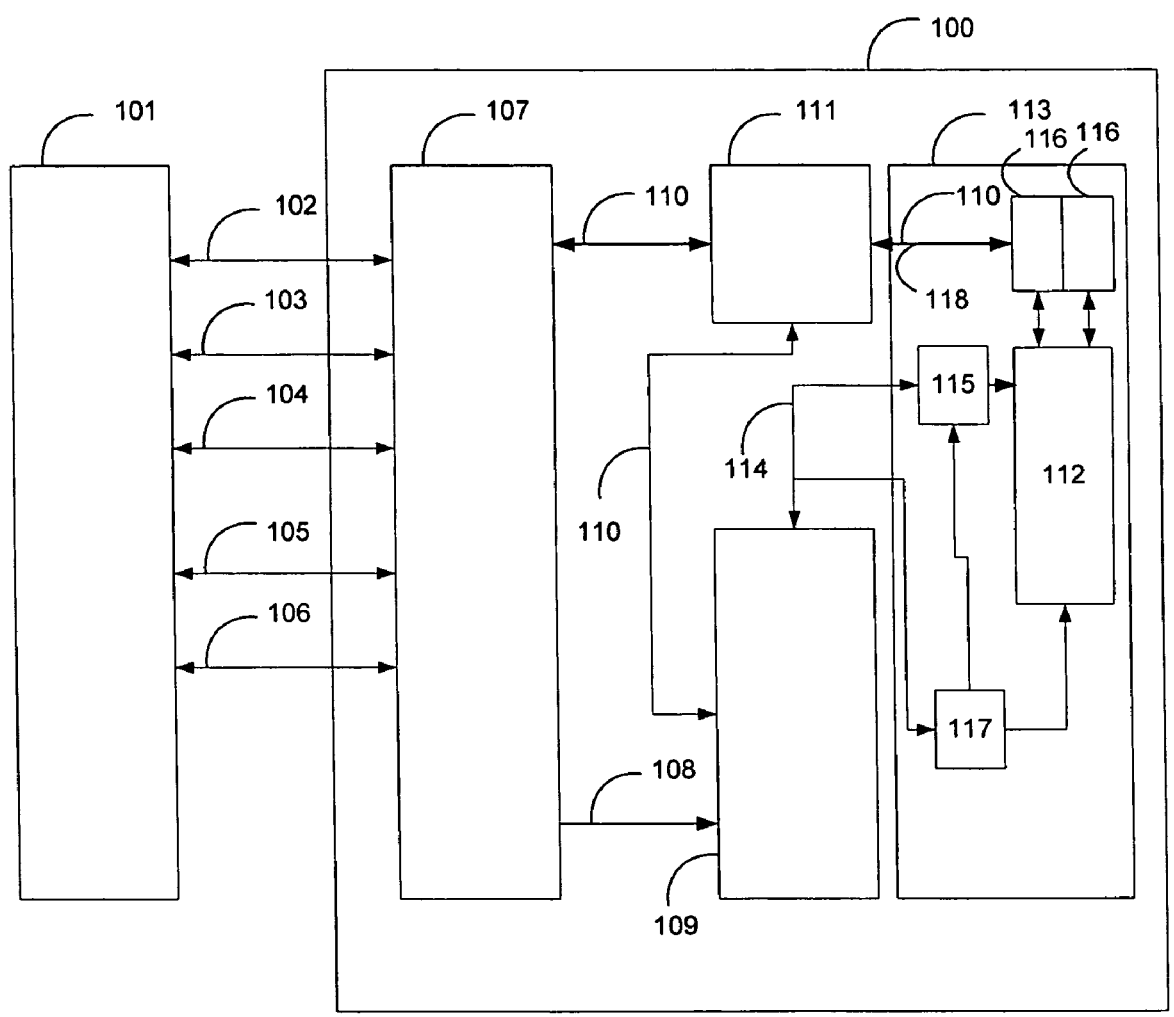
FIG. 1 illustrates a flash memory card and a host communicating with each other in accordance with one embodiment of the present invention.

For clarity, previously defined features retain the reference numerals in subsequent drawings wherever appropriate.

DETAILED DESCRIPTION OF ILLUSTRATIVE EMBODIMENTS

FIG. 1 shows a block diagram of a flash memory card 100 and an information processing appliance 101 (which is referred to as a host hereinafter) according to the exemplary embodiments of the invention.

The flash memory card 100 is connected with the host 101 through, for example, five different times of clients or busses, a data line or a data bus 102, a clock line 103, a power line 104, which provides the power supply voltage $V_{DD}$, a ground line 105 providing a second reference potential, usually the ground potential $V_{SS}$, and a command line 106, which is used to transfer commands from the host 101 to the flash memory card 100.

A host interface 107 of the flash memory card 100 receives commands from the host 101 through the command line 106 and decodes the received commands. When the command is a write command, for example, the host interface 107 decodes the command into a logical address 108 provided by the host 101 as the writing destination of data and sends the logical address 108 to a flash memory controller 109 of the flash memory card 100. Furthermore, the host interface 107 receives data objects 10 to be written from the data line 102 and stores the data objects 110 in a data buffer 111.

In the flash memory controller 109, an address conversion section (not shown) is fed from the host interface 101 with the logical address 108 showing the writing destination of the data object 10. The address conversion section brings the physical addresses of generally more than one area into correspondence with one logical address. Here, one area is equivalent to, for example, two pages inside a non-volatile memory cell array 112 comprising a multiplicity of non-volatile memory cells of the flash memory 113. In particular, the pages belonging to the same area each belong to separate physical blocks. The non-volatile flash memory cell array 112 is generally divided into more than one page each having a fixed number of memory cells, and further divided into more than one physical block each having a fixed number of pages. Each of the memory cells can take two states, "1" and "0". Thereby, one of the memory cells can store one-bit data therein, in the following also referred to as data item. In an alternative embodiment of the invention, each of the memory cells can take four states, thus, one of the memory cells can store two-bit data therein.

The address conversion section, when fed with the logical address 108, showing the writing destination of the data object 110, selects a free blank area in the cell array 112 and assigns the write target area of the data object 110 to the respective free area. The address conversion section further brings the physical address 114 of this area in correspondence with the above-mentioned logical address 108.

A write section (not shown) sends the physical address 114 of the write target area to an address decoder 115 of the flash memory 113. In conjunction with that, the write section sends the data object 110 to be written from the data buffer 111 to a page buffer 116 of the flash memory 113.

The flash memory 113 comprises, for example, two page buffers 116. Each of the page buffers 116 can store one-page data. In other words, the two page buffers 116 can store one-area data in total. Accordingly, the data objects 110 to be written, in the following also denoted as data words, which are sent out from the data buffer 111, are stored in the page buffers 116 on an area-by-area basis. The one-area data items, i.e., the data words, stored in the two page buffers 116 are written in parallel onto the two pages designated by the address decoder 115, according to the prior art, on a word-by-word-basis, according to the invention in a way as will be described in more detail. The flash memory card 100 performs the data writing into the flash memory 113 in the two physical blocks in parallel, thereby shortening the writing duration, wherein data words of a predefined fixed length are used, usually using a data word of 128 bits length, alternatively, using a data word of 64 bits length, 256 bits length, 512 bits length, etc., for example.

The flash memory card 100 brings the physical address of the area in which the new data is to be written, into correspondence with the logical address showing the writing destination. In addition, in the flash memory, data items are erased only collectively in each of the physical blocks mentioned above.

In the flash memory card 100, no overwriting of an already programmed flash memory cell is provided. Usually, before writing new data in a physical block, which has already been programmed, the physical block is firstly erased and then, after the erased process has been finished, the new data is programmed into this physical block.

The erase process is performed by means of an erasing circuit 117, which is coupled to the read section and is provided with the physical address and with the non-volatile memory cell array 112 and the address decoder 115.

According the preferred embodiment of the invention and in difference to the flash memory controller according to the state of the art, the flash memory controller 109 is also connected to the data buffer 111 which transfers the data words 110 from the data buffer 111 to the two page buffers 116. The flash memory controller clearly snoops the data words 110 to be transmitted and determines, as will be described in detail herein below, whether a predetermined maximum number of programmable data items, i.e., data bits, need a change of the state of the respective non-volatile memory cell and therewith needs a remarkable portion of the current provided by the programming pulse used for writing the data into the non-volatile memory cell array.

According to the preferred embodiment of the invention, the non-volatile memory cells of the non-volatile memory cell array 112 are designed as so called twin flash array cells using NROM (Nitrided Read Only Memory) transistors.

However, the invention is applicable for any kind of non-volatile memory cell, for example, a flash non-volatile memory cell in general, a ferroelectric random access memory non-volatile memory cell (FRAM), a magnetic random access memory non-volatile memory cell (MRAM), a phase change memory non-volatile memory cell (PCM), a conductive bridging random access memory non-volatile memory cell (CBRAM), or an organic random access memory non-volatile memory cell (ORAM).

The flash memory cells can be designed as floating gate flash memory non-volatile memory cells or as charge trapping layer flash non-volatile memory cells. The charge trapping layer flash non-volatile memory cells can comprise an oxide-nitride-oxide layer stack (ONO), wherein the charge carriers are trapped in the nitride interface between the lowermost silicon oxide layer and the nitride layer, which is sandwiched between the silicon oxide layers.

Alternatively, the charge-trapping layer can be made of aluminum oxide ($Al_2O_3$), yttrium oxide ($Y_2O_3$), lanthanum oxide ($LaO_2$), hafnium oxide ($HfO_2$), zirconium oxide ($ZrO_2$), amorphous silicon, tantalum oxide ($Ta_2O_5$), titanium oxide ($TiO_2$) and/or an aluminate. An example for an aluminate is an alloy of the components aluminum, zirconium and oxygen (Al, Zr, O).

When data is to be written from the host 101 into the flash memory cell array 112, a write command, as described above, is sent via the command lines 106 to the host interface 107. In addition, the data to be written into the flash memory cell array 112 is transmitted from the host 101 to the host interface 107 via the data lines 102 and from the host interface 107, the data are forwarded to the data buffer 111 via an internal data bus. According to the preferred embodiment of the invention, the data buffer 111 is arranged as a static random access memory (SRAM).

The data stored in the SRAM data buffer 111 and that are to be forwarded, that is transferred from the SRAM data buffer 111 to the memory cell array 112 via the page buffers 116, are sent from the SRAM data buffer 111 via the internal data bus 118 wherein the number m of data words (m is an integer value), wherein each data word may have a length of 128 bits of data or n times 128 bits (n may be, for example, ½, 1, 2, 3, ... ), can vary depending on the number of active bits, i.e., bits that need to be changed within the memory cells of the memory cell array 112 on the one hand and the maximum number of changeable active bits that can be programmed within one programming pulse, on the other hand.

According to the preferred embodiment of the invention, two subsequent data words to be transmitted are examined as to the number of active bits that are included in the two data words.

Figure 2:
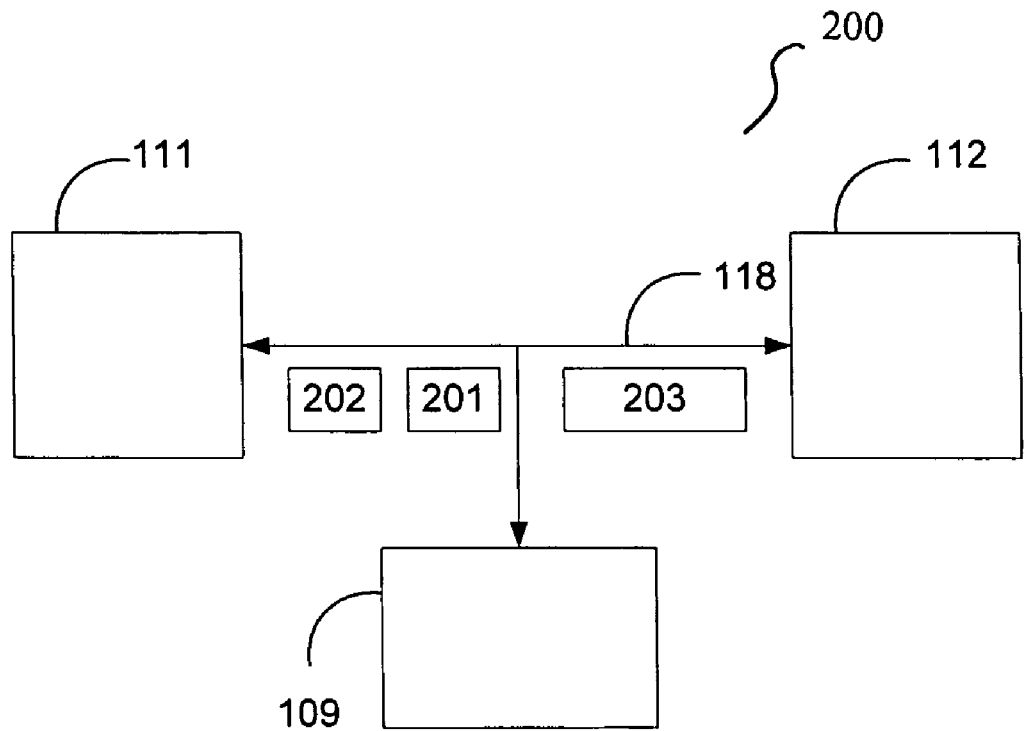
FIG. 2 illustrates the data exchange from a data buffer to the non-volatile memory cell array of the flash memory card in accordance with the present invention.

FIG. 2 shows a principal block diagram 200 illustrating the principle of the present invention.

A first data word 201 of 128 bits is to be transferred to the memory cell 112, i.e., the data bits of the first data word 201 are to be programmed into a physical block of the memory cell array 112 according to the address provided by the address decoder of the flash memory cell controller 109. Furthermore, a second data word 202, also of the length of 128 data bits, is to be written into the memory cell array 112.

The flash memory controller 109 has the information that the two data words 201, 202 are to be transferred from the data buffer 111 to the memory cell array 112 and determines the number of bits of the first data word 201 that need a programming of the memory cell 112 in the sense that the state of the respective memory cell has to be changed by means of the programming pulse.

Figure 4:
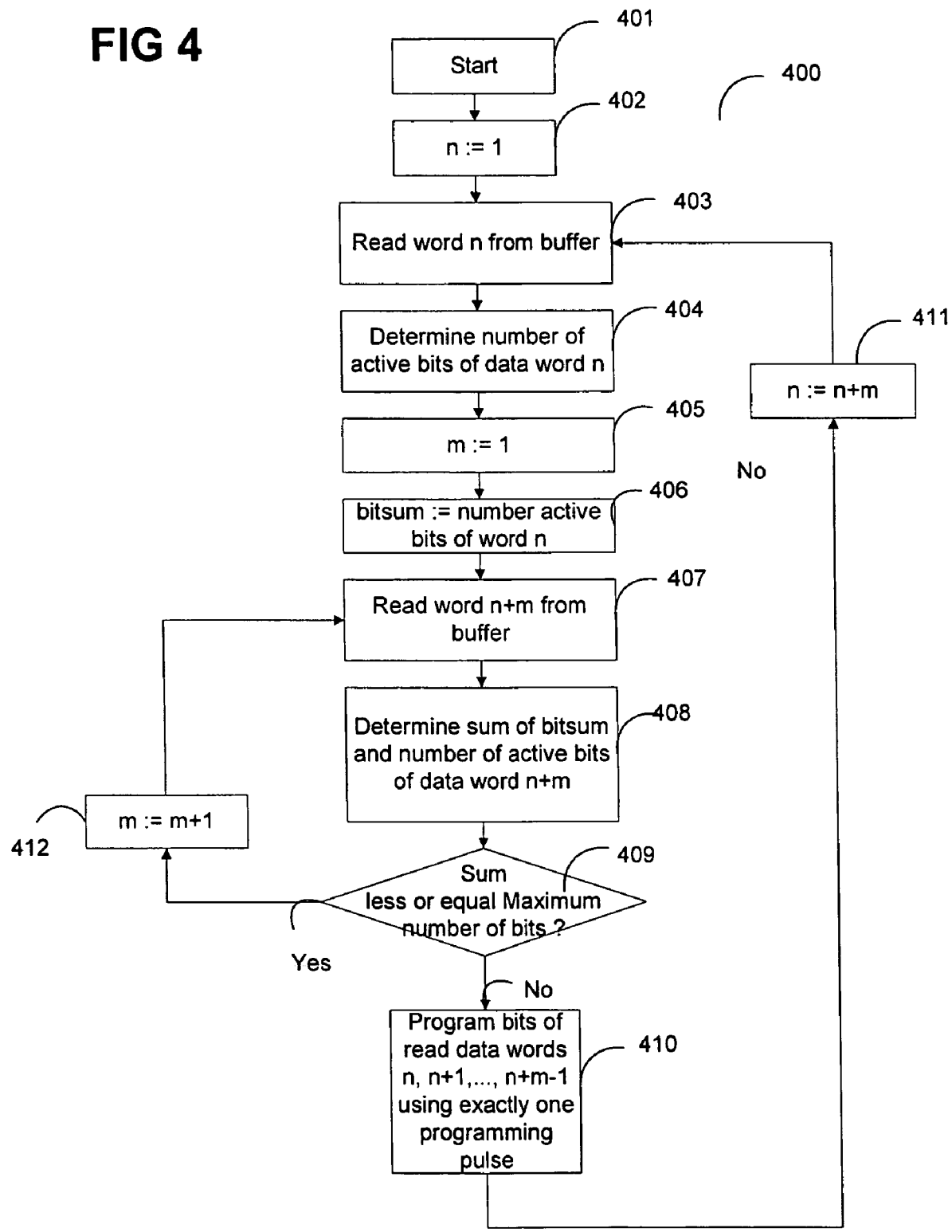
FIG. 4 illustrates a flow diagram showing the steps for programming data into the non-volatile memory cell array in accordance with the present invention.
Figure 5:
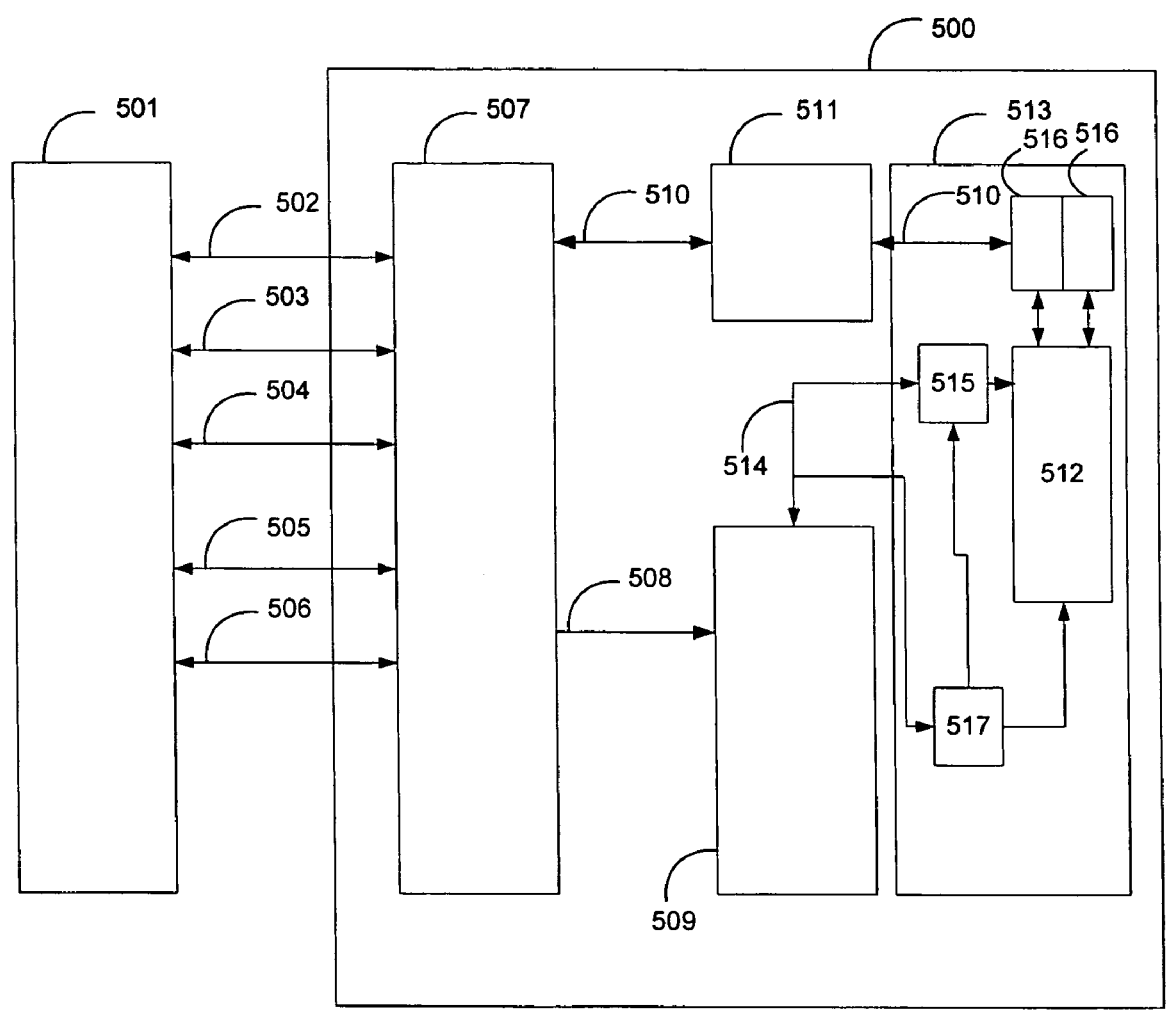
FIG. 5 shows a block diagram of a conventional flash memory card.

As shown in the flow diagram 400 of FIG. 4, according to the method for determining the number of data words that are programmed together using the same programming pulse, the method is started in step 401.

In step 402, a first index n is set to 1.

In step 403, the word n is read from the data buffer 111 by means of the flash memory controller 109, wherein the word n is a data word that is to be transmitted to the memory cell array 112.

For data word n, the number of active bits of this data word is determined, i.e., the number of bits that, when they are programmed in the memory cell array 112, lead to the requirement that the state of the respective memory cell is changed from "0" to "1" or from "1" to "0", depending on what is the reset state (initial state) of the memory cell.

In this context, it should be mentioned that according to the preferred embodiment of the invention, before writing data into the memory cell array 112, the respective physical block is erased and thus transferred to a predefined initial state.

As described above, the flash memory cell array 112 is arranged such that only a predetermined maximum number of alterations of states of memory cells can be performed within exactly one programming pulse.

According to the preferred embodiment of the invention, only 65 bits can be changed with one programming pulse.

In a next step (step 405), a second index m is set to initial value 1.

Furthermore, in step 406, a variable "bitsum" is defined as the number of active bits of word n.

In a next step (step 407) the second data word, generally speaking, the data word n+m, is read from the data buffer 111.

In a next step (step 408), the sum of the value of the variable bitsum and the number of active bits of data word (n+m) is determined.

Subsequently, in step 409, it is determined whether the sum of the value of the variable bitsum and the number of active bits of data word (n+m) is less or equal the maximum number of bits that can be programmed using exactly one programming pulse.

If the sum is larger than the maximum number of bits that can be programmed with one programming pulse, (n+m−1) data words are programmed using exactly one programming pulse.

Clearly stated for two data words, i.e., the first data word 201 and the second data word 202, this means that it is determined in step 409, whether the sum of the active bits of the data words 201, 202 is less than or equal to the maximum number of active bits that can be programmed using one programming pulse and if this is not fulfilled, only the first data word is programmed using exactly one programming pulse (step 410). Then, the first index n is increased by the value 1 (note that in this case m=1) (step 412) and it is returned to step 403, wherein the next data word n is read from the data buffer 111. Now, the next iteration is carried out as described above.

However, if in step 409, it is determined that the sum is less than or equal to the maximum number of bits, the second index m is increased by the value 1 (step 413) and the method is continued in step 407, in which the next data word n+m is read from the data buffer 111 and the steps 408 and 409 are carried out as described above. If the iteration of the steps 409, 412, 407 and 408 is carried out at least for the second data word, which clearly means that the first data word 201 and the second data word 202 together have a number of active bits that is less than or equal to the maximum number of active bits that can be programmed using one programming pulse, the first data word 201 and the second data word 202 are merged into a merged data word 203 (compare FIG. 2) and the merged data word 203 is programmed together using exactly one programming pulse into the memory cell array 112. In this context it should be mentioned that also a plurality of programming pulses may be used for programming the merged data word 203. One aspect of the invention can be seen in the voltage pulsing of the merged data word with the same at least one programming pulse.

Figure 3A:
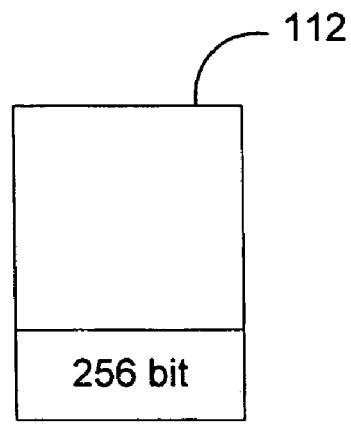
FIG. 3a illustrates a block diagram of a non-volatile memory cell array in accordance with the present invention.
Figure 3B:
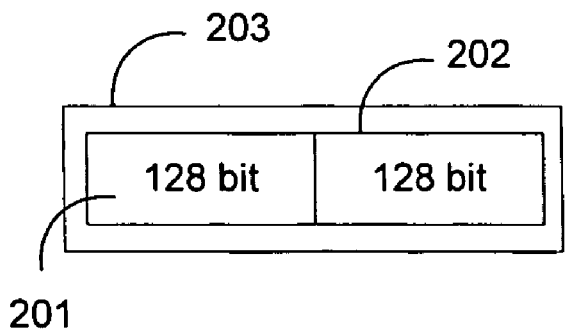
FIG. 3b shows two data words in accordance with the present invention.

As shown in FIG. 3a, the memory cell array 112 can be addressed by a 256 bit word according to the present embodiment of the invention. As described above, there are some operations on the memory cell array 112 that can be performed only on a predetermined maximum number of bits, according to this embodiment of the invention, 65 bits, like the programming of a data word into the memory cell array. Thus, for programming, the basic operation of programming one data word into the memory cell array 112, this works on one data word of 128 bit length in which at most to 65 bits are active bits.

Clearly, one aspect of the invention can be seen in the simple embodiment of the invention wherein two data words, the first data word 201 and the second data word 202 are merely checked as to whether the sum of their active bits is less than or equal to the number of maximum active bits that can be programmed using one programming pulse and if this true, that is in case the number of the sum of the active bits of the two data words 201, 202 is less than or equal to 65 bits, the two data words 201, 202 are merged into a merged data word 203 and all those bits are programmed into the memory cell array 112 in parallel using one programming pulse.

The general idea can be seen in merging two or more data words, for example of the length of 128 bits, if in all data words taken into account only a predetermined maximum number of bits, (for example 65 bits), is active, in other words, the number of zeros is less than 65 since, according to the preferred embodiment, only the bits having the value 1 need to be changed.

One aspect of the invention can further be seen in the utilization of the array such that it optimizes the maximum current per programming pulse by using sequential SRAM data words having 128 data bits.

According to the preferred embodiment of the invention, in which a twin flash memory cell array is provided, the maximum number of bits that can be programmed in parallel is limited by the power supply. Usually, every SRAM word contains the maximum number of bits that can be programmed in parallel. As programming flow proceeds the number of bits that needs to be programmed reduces. If the sum of bits to be programmed in two sequential words equals or is below the maximum current that is available, in other words that the power supply can supply, the two or more SRAM data words can be joined and can be given one programming pulse to both of them in parallel so that they are programmed into the twin flash memory cell array in parallel. In an alternative embodiment, it is provided to compare the content of the physical block that is to be written and that is not erased before the new writing of the data word, which the data word that is to be programmed. As a result of this comparison, the number of bits that need to be changed within the respective physical block is determined and the above-mentioned algorithm is carried out analogously.

It should be appreciated by those skilled in the art, that the described processes may be implemented in hardware, software, firmware or a combination of these implementations as appropriate. For example, the operation of selecting a memory cell may be carried out by word and bit-line decoders under the control of an I/O interface unit such as a computer. Accordingly, the described operations may be implemented as executable instructions stored on a computer readable medium (removable disk, volatile or non-volatile memory, embedded processors, etc.), the stored instruction code operable to program a computer of other such programmable device to carry out the intended functions.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A programming element for programming data into a plurality of non-volatile memory cells of a non-volatile memory cell array, the data being transferred to the non-volatile memory cell array in a data word comprising a plurality of data items, the programming element comprising:

a detection element for detecting at least a first data word and a second data word that are to be transferred to the non-volatile memory cell array;

a determination element for determining the number of data items in the first data word and the second data word that need a change of the state of a respective non-volatile memory cell;

a comparator element for comparing the determined number of data items with a maximum number of programmable data items using one programming pulse; and a data word merge control element for merging the first data word with the second data word into a merged data word to be programmed into the non-volatile memory cell array if the determined number is less than or equal to the maximum number, wherein the merged data word is to be programmed into the non-volatile memory cells together using the same at least one programming pulse.

2. The programming element of claim 1, wherein:

the detection element is operable for detecting at least a third data word that is to be transferred to the non-volatile memory cell array;

the determination element is operable for determining the number of data items in the first data word, the second data word and third data word that need a change of the state of a respective non-volatile memory cell;

the comparator element is operable for comparing the determined number of data items with the maximum number of programmable data items using one programming pulse; and the data word merge control element is operable for merging the first data word with the second data word and with the third data word into the merged data word to be programmed into the non-volatile memory cell array if the determined number is less than or equal to the maximum number, wherein the merged data word is to be programmed into the non-volatile memory cells together using the same programming pulse.

3. The programming element of claim 1, wherein each data word comprises the same number of data items.

4. The programming element of claim 3, wherein each data word comprises 128 data items.

5. The programming element of claim 1, wherein the maximum number of data items is 65.

6. A non-volatile memory cell device, comprising:

a data buffer for buffering data;

a non-volatile memory cell array comprising a plurality of non-volatile memory cells, the non-volatile memory cell array being coupled to the data buffer for the transfer of the buffered data to the non-volatile memory cell array, the data being transferred to the non-volatile memory cell array in a data word comprising a plurality of data items; and a programming unit for programming the data from the data buffer into the plurality of non-volatile memory cells of the non-volatile memory cell array, the programming unit comprising:

a detection element for detecting at least a first data word and a second data word, which are to be transferred from the data buffer to the non-volatile memory cell array;

a determination element for determining the number of data items in the first data word and the second data word that need a change of the state of a respective non-volatile memory cell;

a comparator element for comparing the determined number of data items with a maximum number of programmable data items using one programming pulse; and a data word merge control element for merging the first data word with the second data word into a merged data word to be programmed into the non-volatile memory cell array if the determined number is less than or equal to the maximum number, wherein the merged data word is to be programmed into the non-volatile memory cells together using the same at least one programming pulse.

7. The non-volatile memory cell device of claim 6, wherein the data buffer is a static random access memory.

8. The non-volatile memory cell device of claim 6, wherein the non-volatile memory cell array comprises non-volatile memory cells being selected from the group of:

flash non-volatile memory cells;

ferroelectric random access memory non-volatile memory cells;

magnetic random access memory non-volatile memory cells;

phase change memory non-volatile memory cells;

conductive bridging random access memory non-volatile memory cells; and organic random access memory non-volatile memory cells.

9. The non-volatile memory cell device of claim 6, wherein the non-volatile memory cell array comprises floating gate flash non-volatile memory cells or charge trapping layer flash non-volatile memory cells.

10. The non-volatile memory cell device of claim 6, wherein the non-volatile memory cell array comprises nitride read only memory flash non-volatile memory cells.

11. The non-volatile memory cell device of claim 6, further comprising a data bus for connecting the data buffer with the non-volatile memory cell array for the transfer of the data.

12. The non-volatile memory cell device of claim 6, wherein:

the detection element is operable for detecting at least a third data word which is to be transferred to the non-volatile memory cell array;

the determination element is operable for determining the number of data items in the first data word, the second data word and third data word that need a change of the state of a respective non-volatile memory cell;

the comparator element is operable for comparing the determined number of data items with the maximum number of programmable data items using one programming pulse; and the data word merge control element is operable for merging the first data word with the second data word and with the third data word into the merged data word to be programmed into the non-volatile memory cell array if the determined number is less than or equal to the maximum number, wherein the merged data word is to be programmed into the non-volatile memory cells together using the same programming pulse.

13. The non-volatile memory cell device of claim 6, wherein each data word comprises the same number of data items.

14. The non-volatile memory cell device of claim 6, wherein each data word comprises 128 data items.

15. The non-volatile memory cell device of claim 6, wherein the maximum number of data items is 65.

16. A method for programming data into a plurality of non-volatile memory cells of a non-volatile memory cell array, the data being transferred to the non-volatile memory cell array in a data word comprising a plurality of data items, the method comprising:

detecting at least a first data word and a second data word that are to be transferred to the non-volatile memory cell array;

determining the number of data items in the first data word and the second data word that need a change of the state of a respective non-volatile memory cell;

comparing the determined number of data items with a maximum number of programmable data items using one programming pulse; and merging the first data word with the second data word into a merged data word to be programmed into the non-volatile memory cell array if the determined number is less than or equal to the maximum number, wherein the merged data word is to be programmed into the non-volatile memory cells together using the same at least one programming pulse.

17. The method of claim 16, further comprising:

detecting at least a third data word that is to be transferred to the non-volatile memory cell array;

determining the number of data items in the first data word, the second data word and third data word that need a change of the state of a respective non-volatile memory cell;

comparing the determined number of data items with the maximum number of programmable data items using one programming pulse; and merging the first data word with the second data word and with the third data word into the merged data word to be programmed into the non-volatile memory cell array if the determined number is less than or equal to the maximum number, wherein the merged data word is to be programmed into the non-volatile memory cells together using the same programming pulse.

18. The programming element of claim 16, wherein each data word comprises the same number of data items.

19. The programming element of claim 18, wherein each data word comprises 128 data items.

20. The programming element of claim 16, wherein the maximum number of data items is 65.

* * * * *